(12) United States Patent
Shim et al.

(10) Patent No.: US 9,664,894 B2
(45) Date of Patent: May 30, 2017

(54) MICRO OPTICAL SWITCH DEVICE, IMAGE DISPLAY APPARATUS INCLUDING THE SAME, AND METHOD OF MANUFACTURING THE MICRO OPTICAL SWITCH DEVICE

(71) Applicant: SAMSUNG ELECTRONICS CO., LTD., Suwon-si (KR)

(72) Inventors: Dong-sik Shim, Hwaseong-si (KR); Woon-bae Kim, Seoul (KR); Hyung Choi, Seongnam-si (KR)

(73) Assignee: SAMSUNG ELECTRONICS CO., LTD., Suwon-s (KR)

( * ) Notice: Subject to any disclaimer, the term of this patent is extended or adjusted under 35 U.S.C. 154(b) by 226 days.

(21) Appl. No.: 14/078,716

(22) Filed: Nov. 13, 2013

(65) Prior Publication Data
US 2014/0133003 A1 May 15, 2014

(30) Foreign Application Priority Data

Nov. 13, 2012 (KR) .................. 10-2012-0128264

(51) Int. Cl.
*G02B 26/02* (2006.01)
*B81B 7/00* (2006.01)

(52) U.S. Cl.
CPC .......... *G02B 26/023* (2013.01); *B81B 7/0016* (2013.01); *B81B 2201/045* (2013.01); *B81B 2203/0163* (2013.01)

(58) Field of Classification Search
CPC G02B 26/0841; G02B 26/105; G02B 26/085; G02B 26/0858; G02B 26/0833; G02B 26/101; G02B 26/02; G02B 26/023; B81B 3/0083; B81B 3/0086; B81B 2203/04
See application file for complete search history.

(56) References Cited

U.S. PATENT DOCUMENTS

| | | | |
|---|---|---|---|
| 6,411,423 B2 | 6/2002 | Ham | |
| 6,647,171 B1 | 11/2003 | Fu et al. | |
| 2007/0223080 A1* | 9/2007 | Hagood, IV | G02B 26/02 359/298 |
| 2008/0062500 A1* | 3/2008 | Hagood, IV | G02B 6/0043 359/230 |

FOREIGN PATENT DOCUMENTS

| | | |
|---|---|---|
| JP | 2003262803 A | 9/2003 |
| JP | 200944787 A | 2/2009 |
| KR | 100558319 B1 | 3/2006 |
| KR | 1020080040727 A | 5/2008 |
| KR | 1020100039383 A | 4/2010 |
| KR | 1020110038126 A | 4/2011 |

\* cited by examiner

*Primary Examiner* — Jennifer L. Doak
(74) *Attorney, Agent, or Firm* — Sughrue Mion, PLLC

(57) ABSTRACT

A micro optical switch device, an image display apparatus including the same, and a method of manufacturing the micro optical switch device are provided. The micro optical switch device includes a substrate; a first electrode disposed on the substrate and having a plurality of openings; a second electrode disposed above and spaced apart from the first electrode, and having a plurality of openings; and support units disposed on the substrate and configured to support the second electrode, wherein the support units include deformation preventing portions protruding beyond a top surface of the second electrode.

20 Claims, 5 Drawing Sheets

MICRO OPTICAL SWITCH DEVICE, IMAGE DISPLAY APPARATUS INCLUDING THE SAME, AND METHOD OF MANUFACTURING THE MICRO OPTICAL SWITCH DEVICE

CROSS-REFERENCE TO RELATED APPLICATION

This application claims priority from Korean Patent Application No. 10-2012-0128264, filed on Nov. 13, 2012 in the Korean Intellectual Property Office, the disclosure of which is incorporated herein by reference in its entirety.

BACKGROUND

1. Field

Apparatuses and methods consistent with exemplary embodiments relate to a micro optical switch device, an image display apparatus including the same, and a method of manufacturing the micro optical switch device.

2. Description of the Related Art

A variety of display apparatuses have been developed such as cathode ray tube (CRT) type display apparatuses and flat panel display apparatuses, such as liquid crystal displays (LCDs) and plasma display panels (PDPs).

In CRT type display apparatuses, an image is displayed when an electron beam collides with a fluorescent material. The CRT type display apparatuses are, however, difficult to manufacture, transport, and use because of the large cubic dimensions of the CRT displays, particularly the greater widths of the CRT displays. Alternatively, a variety of flat panel display apparatuses have been developed which generally have substantially smaller width values as compared to CRT displays.

SUMMARY

One or more exemplary embodiments provide a micro optical switch device including a deformation preventing mechanism that prevents the micro optical switch device from being deformed, and an image display apparatus including the same.

One or more exemplary embodiments also provide a method of manufacturing a micro optical switch device including a deformation preventing mechanism.

According to an aspect of an exemplary embodiment, there is provided a micro optical switch device including a substrate; a first electrode disposed on the substrate and having a plurality of openings; a second electrode disposed above and spaced apart from the first electrode, and having a plurality of openings; and support units disposed on the substrate and configured to support the second electrode, wherein the support units include deformation preventing portions protruding beyond a top surface of the second electrode.

The deformation preventing portions may be formed at edge portions of the second electrode.

The deformation preventing portions may be formed of a material used to form the second electrode.

The deformation preventing portions each may have a concave-convex shape.

The support units may further include fixing portions disposed on the substrate.

The fixing portions may be spaced apart from the first electrode.

The plurality of openings of the first electrode may be offset from and may not overlap the plurality of openings of the second electrode.

The micro optical switch device may further include an insulating layer interposed between the first electrode and the second electrode.

The insulating layer may be disposed on a top surface of the first electrode.

The insulating layer may be disposed on a bottom surface of the second electrode.

According to an aspect of an exemplary embodiment, there is provided an image display apparatus including a backlight unit for outputting light, a micro optical switch device including a substrate, a first electrode formed on the substrate, wherein the first electrode includes a first plurality of openings, a second electrode formed above and spaced apart from the first electrode, wherein the second electrode includes a second plurality of openings formed above and offset from the first plurality of opening, and support units formed at both sides of the substrate to support the second electrode, wherein the support units include deformation preventing portions protruding beyond a top surface of the second electrode, and a display panel for forming an image by adjusting an amount of light, which is emitted from the micro optical switch device.

According to an aspect of an exemplary embodiment, there is provided a method of manufacturing a micro optical switch device, the method including disposing a conductive material layer on a substrate and patterning the conductive material layer to form a first electrode including a first plurality of openings, disposing an insulating material layer on the substrate and the first electrode and patterning the insulating material layer to form an insulating layer, disposing a sacrificial layer on the substrate, the first electrode, and the insulating layer, patterning a region of the sacrificial layer to form a hole exposing the substrate, and disposing a pattern for forming deformation preventing portions on a region of the sacrificial layer adjacent to an inner side of the hole, disposing a conductive material on the sacrificial layer, the pattern, and in the hole, patterning the conductive material into the deformation preventing portions and fixing portions, and removing the sacrificial layer and the pattern.

The insulating layer may be formed between the first electrode and the second electrode where there is overlap.

The hole may be formed such that the hole is spaced apart from the first electrode.

BRIEF DESCRIPTION OF THE DRAWINGS

These and/or other aspects will become apparent and more readily appreciated from the following description of exemplary embodiments, taken in conjunction with the accompanying drawings of which.

DETAILED DESCRIPTION

Figure 1:
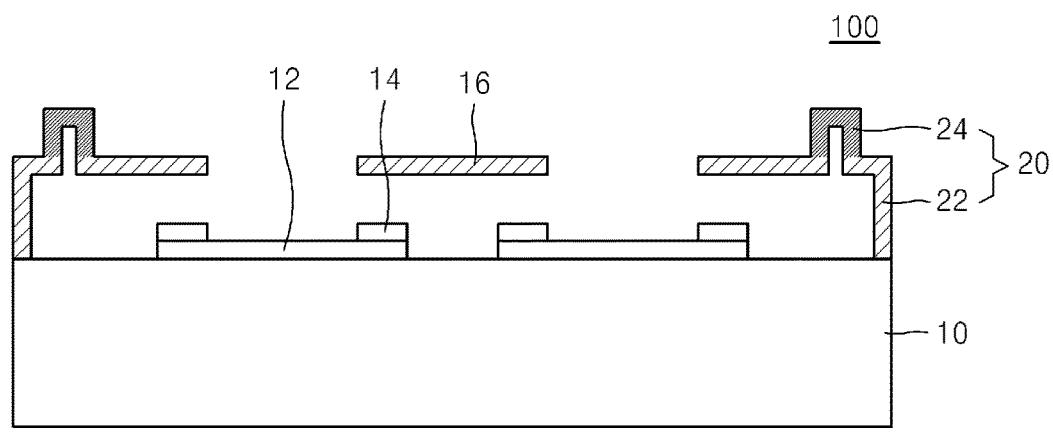
FIG. 1 is a cross-sectional view of a micro optical switch device according to an exemplary embodiment

Hereinafter, a micro optical switch device, an image display apparatus including the same, and a method of manufacturing the micro optical switch device according to exemplary embodiments will be described in detail with reference to the accompanying drawings. In the drawings, the thickness of layers and regions may be exaggerated for clarity. The same reference numerals represent the same elements throughout the drawings. As used herein, the term "and/or" includes any and all combinations of one or more of the associated listed items. Expressions such as "at least one of," when preceding a list of elements, modify the entire list of elements and do not modify the individual elements of the list.

Figure 2:
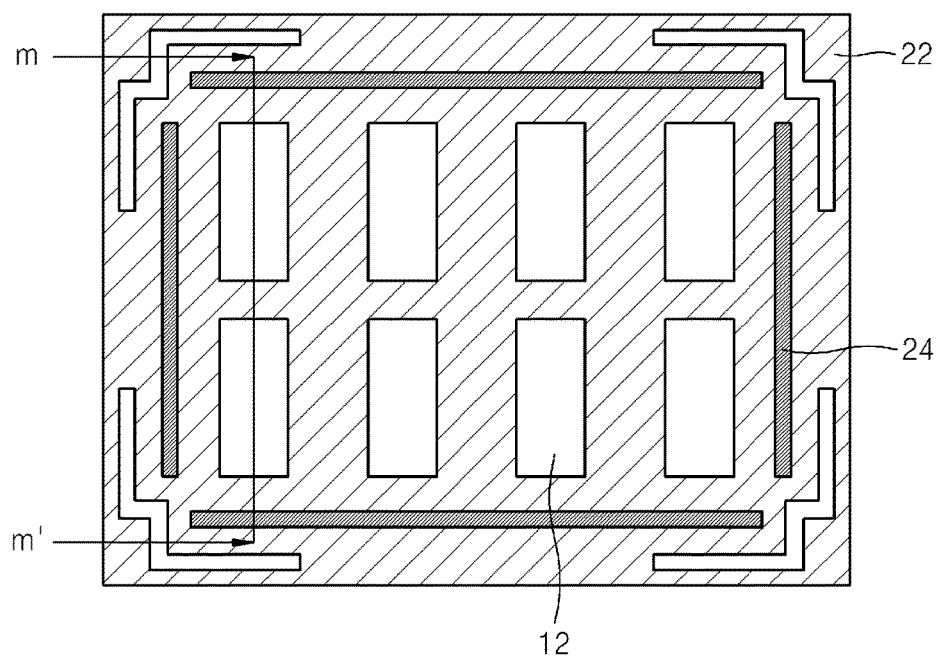
FIG. 2 is a plan view of the micro optical switch device according to an exemplary embodiment.

FIG. 1 is a cross-sectional view of a micro optical switch device 100 according to an exemplary embodiment. FIG. 2 is a plan view of the micro optical switch device 100 of FIG. 1. FIG. 1 may be a cross-sectional view taken along a line m-m' of FIG. 2.

Referring to FIGS. 1 and 2, the micro optical switch device 100 may include a first electrode 12 having a plurality of openings and being formed on a substrate 10, and a second electrode 16 having a plurality of openings and being disposed above the first electrode 12 to be spaced apart from the first electrode 12. A support structure including support units 20 may be formed at both sides of the substrate 10 to support the second electrode 16. Each of the support units 20 may include a fixing portion 22 fixedly formed on the substrate 10, and a deformation preventing portion 24 that prevents deformation, e.g., bending, of the second electrode 16.

Elements of the micro optical switch device 100 according to an exemplary embodiment will now be described in detail.

The substrate 10 may be formed of a transmissive material having non-conductive and non-amorphous properties that allows light emitted from a backlight unit below the substrate 10 to be transmitted therethrough. For example, the substrate 10 may be formed of amorphous glass.

The first electrode 12 and the second electrode 16 may be each formed of a conductive material having high reflectivity and high light blocking properties that reflects the light passing through the substrate 10. The first electrode 12 and the second electrode 16 may be formed of, for example, metal, a conductive metal oxide, a conductive metal nitride, a carbon nano structure, a conductive polymer, a metal nano particle dispersion film, or the like. For example, the first electrode 12 and the second electrode 16 may be each formed of a carbon nano structure, such as carbon nanotube (CNT) or graphene; a conductive polymer, such as polypyrrole, polyaniline, polyacetylene, polythiophene, polyphenylene vinylene, polyphenylene sulfide, poly p-phenylene, or polyheterocycle vinylene; a metal oxide, such as indium tin oxide (ITO), aluminum zinc oxide (AZO), indium zinc oxide (IZO), tin oxide ($SnO_2$), or $In_2O_3$; or a metal nano particle dispersion thin film, such as Al, Cu, Au, or Ag. Also, a colored material, e.g., a black material, which blocks light, may be added to the first electrode 12 and the second electrode 16 in order to increase the light blocking properties thereof. Also, surfaces of the first electrode 12 and the second electrode 16 may be coated with a reflective material in order to increase the reflectiveness.

As mentioned above, the first electrode 12 and the second electrode 16 may each include the plurality of openings. The openings in the first electrode 12 and the openings in the second electrode 16 may be formed not to directly face one another and not to overlap with one another. The plurality of openings in the first electrode 12 and the second electrode 16 may be formed in any of various shapes, e.g., a circular shape, an oval shape, a triangular shape, a rectangular shape, a diamond shape, etc. Also, the sizes of the plurality of openings in the first electrode 12 and the second electrode 16 may be the same or may be different.

An insulating layer 14 may be formed on the first electrode 12 to insulate the first electrode 12 and the second electrode 16 from each other. Although FIG. 1 illustrates that the insulating layer 14 is formed on a top surface of the first electrode 12, the insulating layer 14 may be selectively formed on a bottom surface of the second electrode 16. The insulating layer 14 may be formed in regions in which the first electrode 12 and the second electrode 16 face each other to overlap with each other. When the second electrode 16 is moved toward the first electrode 12 by applying a voltage to the micro optical switch device 100, the insulating layer 14 may contact the second electrode 16. The insulating layer 14 may include a material having light blocking properties. For example, the insulating layer 14 may include at least one selected from the group consisting of $ZrO_2$, $TiO_2$, MgO, $CeO_2$, $Al_2O_3$, $HfO_2$, NbO, $SiO_2$, and $Si_3N_4$.

The support units 20 formed at both sides of the micro optical switch device 100 may support the first and second electrodes 12 and 16 such that the first and second electrodes 12 and 16 are separated from each other. As mentioned above, the support units 20 may each include the fixing portion 22 that is fixedly formed on the substrate 10, and the deformation preventing portion 24 that is formed to protrude, thereby preventing the second electrode 16 from being deformed.

Each of the fixing portions 22 may be formed in a region at the end portions of the micro optical switch device 100. Referring to the plan view of FIG. 2, the fixing portions 22 may be formed at corner portions of the micro optical switch device 100 at outer sides of the deformation preventing portions 24, respectively. Optionally, the locations and number of the fixing portions 22 may be adjusted. The thicknesses of the fixing portion 22 may be determined according to a voltage applied to the first electrode 12 and the second electrode 16. For example, the higher the voltage applied, the thicker the support units 20. The deformation preventing portions 24 may protrude upward from the second electrode 16, and may be formed in an upward protruding folded beam shape when edge portions of the second electrode 16 are folded.

The shape of cross-sections of the deformation preventing portions 24 is not limited. For example, each of the cross-sections of the deformation preventing portions 24 may have a concave-convex shape as illustrated in FIG. 1 or may have a multiple convex-concave shape in which a concave-convex shape is formed on a top surface of another concave-convex shape.

The second electrode 16 may be formed in a thin film form, and may move in an upward/downward direction when the micro optical switch device 100 is driven. However, stress may be applied to the second electrode 16 due to the upward/downward movement, a temperature change, or other external shocks, thereby causing the second electrode 16 to deform, e.g., to bend. Thus, the deformation of the second electrode 16 may be prevented by forming the deformation preventing portions 24 around the second electrode 16. The deformation preventing portions 24 does not need to be formed at all of the edge portions of the second electrode 16, and may be formed at some of the edge portions of the second electrode 16 as illustrated in FIG. 2. Also, referring to the plan view of FIG. 2, the deformation preventing portions 24 may be formed to have a linear shape or may be formed to have a curved shape.

For convenience of manufacture, the deformation preventing portions 24 may be formed simultaneously with the formation of the second electrode 16 and using the material used to form the second electrode 16. The fixing portions 22 may be formed of an elastic conductive material or an elastic polymeric material. For example, the fixing portions 22 may include silicon, polysiloxanes, polyurethanes, polysilicon-polyurethane, rubber, ethylene-vinyl acetate copolymer, phenolic nitrile rubber, styrene butadiene rubber, polyether-block-amides, polyolefins, various gels, or other similar materials. For convenience of manufacture, the fixing portions 22 may also be formed simultaneously with formation of the second electrode 16 and using the material used to form the second electrode 16.

Figure 3:
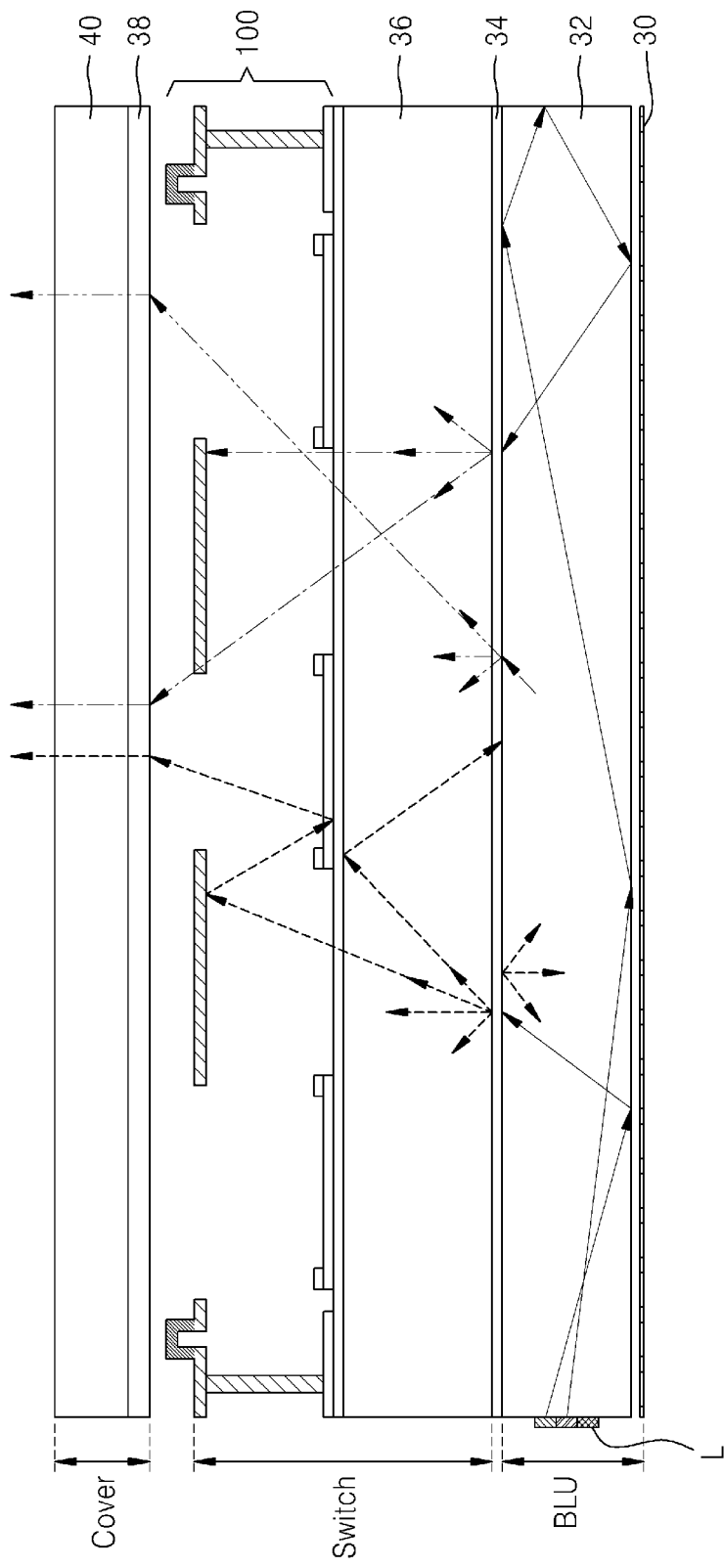
FIG. 3 is a cross-sectional view of an image display apparatus including a micro optical switch device according to an exemplary embodiment.

FIG. 3 is a cross-sectional view of an image display apparatus including a micro optical switch device 100 according to an exemplary embodiment. Referring to FIG. 3, the image display apparatus includes a backlight unit 32 including a light source L and a light guide plate, and a reflection plate 30 formed on a bottom surface of the backlight unit 32. A display panel is formed on the backlight unit 32, and may include a diffusion plate 34, a first display plate 36, the micro optical switch device 100, an optical film 38, and a second display plate 40.

One micro optical switch device 100 may be disposed for each of pixels, and various voltages may be applied to the micro optical switch device 100. The second electrode 16 is moved in an upward/downward direction to adjust the amount of light to be transmitted upward from the micro optical switch device 100 according to a voltage applied to the micro optical switch device 100.

Referring to FIGS. 1 to 3, light supplied from the optical source L at a side of the backlight unit 30 is discharged upward from the backlight unit 30, sequentially passes through the diffusion plate 34 and the first display plate 36, and is then incident on the micro optical switch device 100 via the openings in the first electrode 12 of the micro optical switch device 100. The light incident on the micro optical switch device 100 may pass through the micro optical switch device 100 via the openings in the first electrode 12 and the openings in the second electrode 16 but some of the light may be reflected from the first electrode 12 or the second electrode 16. The reflected light may be incident on the backlight unit 32, be reflected from the backlight unit 32, and be then incident on the micro optical switch device 100 again. When a voltage is applied to the micro optical switch device 100, the second electrode 16 may be moved in an upward/downward direction, the distance between the first electrode 12 and the second electrode 16 may be shortened and the amount of the light being emitted upward via the openings in the second electrode 16 may be adjusted. When the application of the voltage to the micro optical switch device 100 is discontinued, the second electrode 16 returns back to its original position such that the distance between the second electrode 16 and the first electrode 12 increases. The deformation of the second electrode 16, which is formed to have a thin film form, due to the movement thereof may be prevented by forming the deformation preventing portions 24.

The optical film 38 may change the path of the light being emitted from the micro optical switch device 100 such that the light is supplied to the second display plate 40. The optical film 38 may be a prism, a diffusion plate, or a polarizing plate. However, the optical film 38 is not an indispensable element and may thus be optionally omitted. In this case, the second display plate 40 may be disposed as a cover on the micro optical switch device 100.

A wire may be formed on the first display plate 36 or the second display plate 40 to supply a signal to the micro optical switch device 100, and the second display plate 40 may include black matrices and color filters. The color filters may be disposed in units of pixels that are units used to display an image. A black matrix may be disposed between adjacent color filters to differentiate pixels from one another. The color filters add the impression of a color to light, and may generally include a red filter, a green filter, and a blue filter.

A method of manufacturing a micro optical switch device 100 according to an exemplary embodiment will now be described with reference to FIGS. 4A to 4I.

FIGS. 4A to 4I are cross-sectional views illustrating a method of manufacturing a micro optical switch device 100 according to an exemplary embodiment.

Figure 4A:
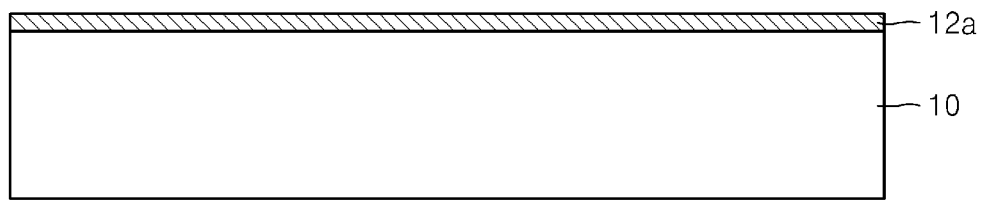
FIGS. 4A through 4I are cross-sectional views illustrating a method of manufacturing a micro optical switch device according to an exemplary embodiment.

Referring to FIG. 4A, a conductive material layer 12a is formed on a substrate 10. The conductive material layer 12a may be formed of a material having high optical reflectivity and low transmissivity. For example, the conductive material layer 12a may be formed of a carbon nano structure, such as carbon nanotube (CNT) or graphene; a conductive polymer, such as polypyrrole, polyaniline, polyacetylene, polythiophene, polyphenylene vinylene, polyphenylene sulfide, poly p-phenylene, or polyheterocycle vinylene; a metal oxide, such as indium tin oxide (ITO), aluminum zinc oxide (AZO), indium zinc oxide (IZO), tin oxide ($SnO_2$), or $In_2O_3$; or a metal nano particle dispersion thin film, such as Al, Cu, Au, or Ag.

Figure 4B:
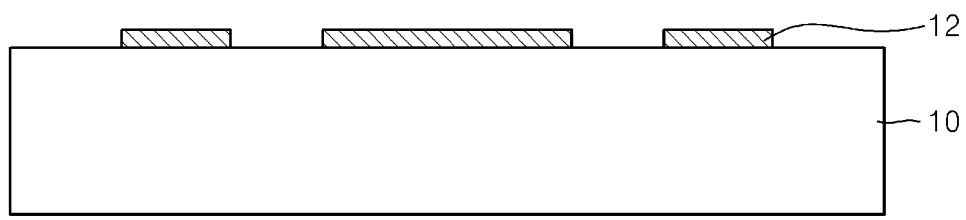

Referring to FIG. 4B, the conductive material layer 12a is patterned to form a first electrode 12. The first electrode 12 may have a structure including a plurality of openings therein.

Figure 4C:
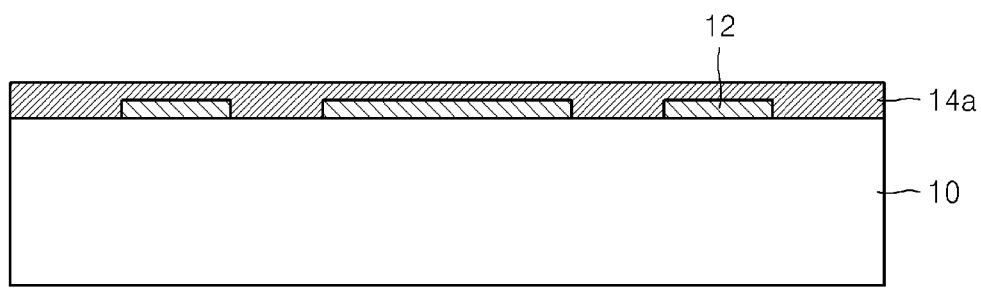

Referring to FIG. 4C, an insulating material layer 14a is formed on the substrate 10 and the first electrode 12. The insulating material layer 14a may be formed of an insulating material including at least one selected from the group consisting of $ZrO_2$, $TiO_2$, $MgO$, $CeO_2$, $Al_2O_3$, $HfO_2$, $NbO$, $SiO_2$, and $Si_3N_4$.

Figure 4D:
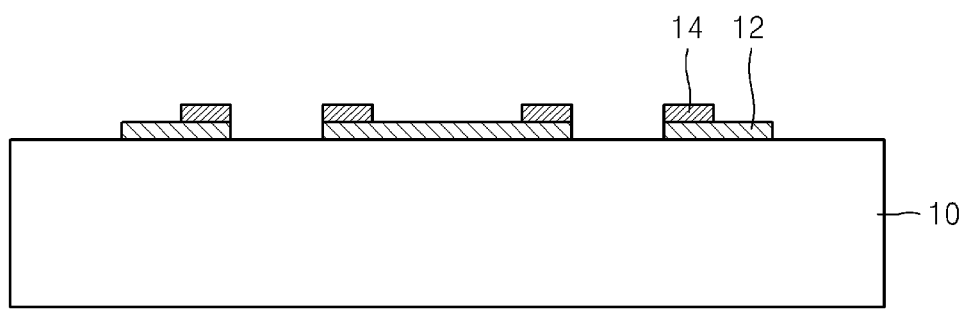

Referring to FIG. 4D, the insulating material layer 14a is patterned to form an insulating layer 14 on a region of the first electrode 12. The location of the insulating layer 14 is selectively determined. For example, the insulating layer 14 may be formed at a side of, both sides of, or on an entire top surface of the first electrode 12.

Figure 4E:
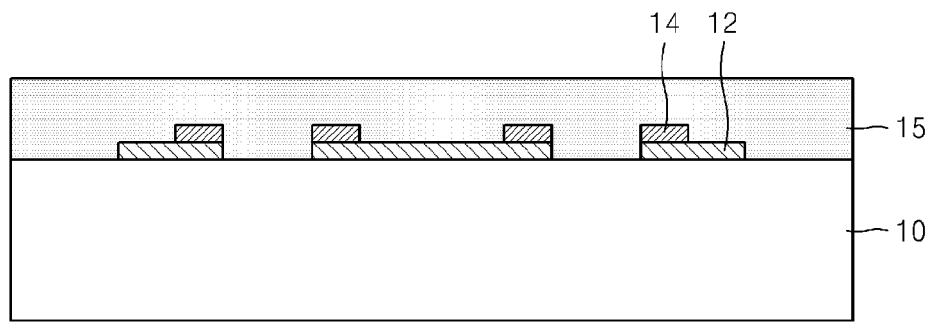

Referring to FIG. 4E, a sacrificial layer 15 is formed to cover the substrate 10, the first electrode 12, and the insulating layer 14. The sacrificial layer 15 may be formed of a material that is removable after a second electrode 16 is formed thereon. For example, the sacrificial layer 15 may be formed of a photosensitive material that chemically reacts with light, e.g., a solid powder or a volatile solvent, or may be formed of a polymeric material.

Figure 4F:
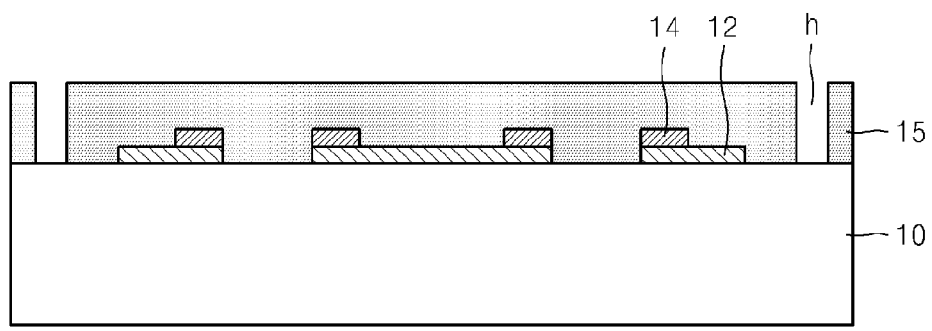

Referring to FIG. 4F, a region of the sacrificial layer 15 is patterned to form a hole h via which a region of the substrate 10 is exposed. The hole h may be formed in at least one side region of the sacrificial layer 15, and may be formed on a location on the sacrificial layer 15 which is disposed apart from the first electrode 12.

Figure 4G:
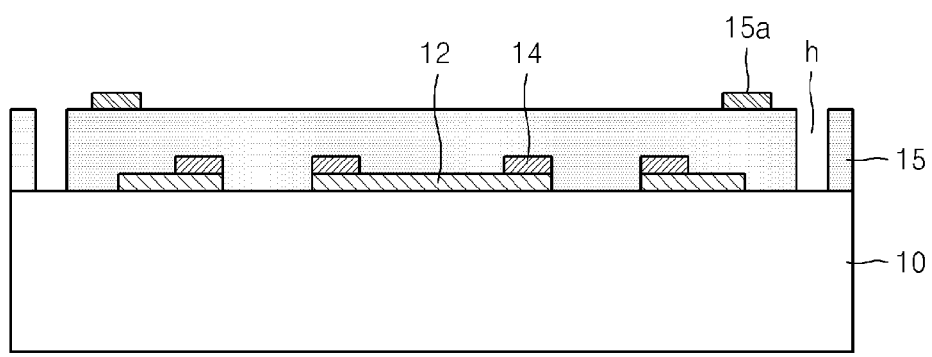

Referring to FIG. 4G, a pattern 15a for forming deformation preventing portions is formed on a region of the sacrificial layer 15 adjacent to an inner side of the hole h. The pattern 15a may be formed of the material used to form the sacrificial layer 15. The shape and size of the pattern 15a may be selectively determined according to the shape and size of the deformation preventing portions to be formed.

Figure 4H:
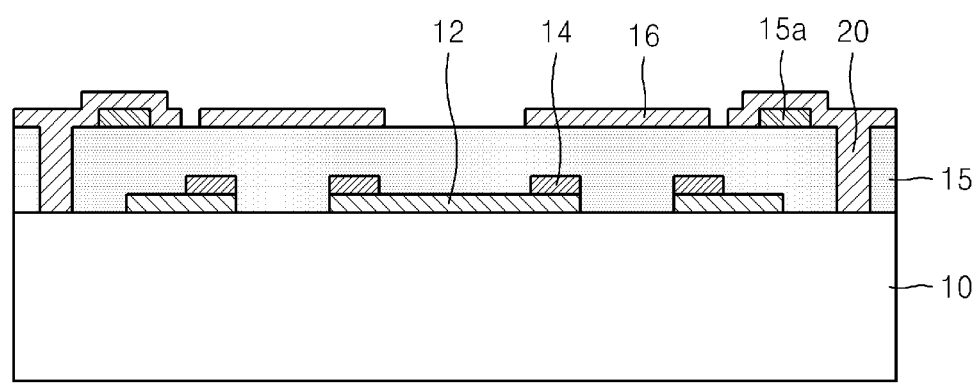

Referring to FIG. 4H, the second electrode 16 and a support unit 20 are formed by applying a conductive material on the sacrificial layer 15 and the pattern 15a and in the hole h, and patterning the resultant structure. The support unit 20 may be formed of a material that is different from that of the second electrode 16. Otherwise, for convenience of manufacture, the support unit 20 may be formed simultaneously with the formation of the second electrode 16 and by using the same material as that used to form the second electrode 16. When the resultant structure is patterned, the second electrode 16 may have a structure including a plurality of openings. The plurality of openings in the second electrode 16 may be formed not to directly face the plurality of openings in the first electrode 12.

Figure 4I:
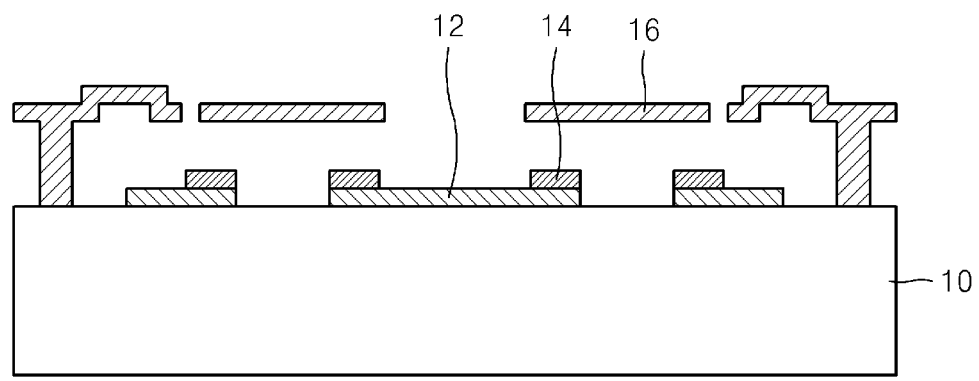

Then, referring to FIG. 4I, the sacrificial layer 15 and the pattern 15a for forming the deformation preventing portions 24 are removed, thus completing the micro optical switch device 100. The sacrificial layer 15 and the pattern 15a may be easily removed using an ashing process.

As described above, according to the one or more exemplary embodiments, there are provided a micro optical switch device having a structure in which deformation preventing portions are formed adjacent to a second electrode so as to prevent the second electrode from deforming due to a movement thereof, which may be caused when the micro optical switch device is driven, a temperature change occurs, or other external shocks are experienced, and an image display apparatus including the micro optical switch device.

Also, according to the one or more exemplary embodiments, there is provided a method of manufacturing a micro optical switch device including a second electrode layer and a deformation preventing layer for preventing deformation of the second electrode layer.

It should be understood that the exemplary embodiments described herein should be considered in a descriptive sense only and not for purposes of limitation. Descriptions of features or aspects within each embodiment should typically be considered as available for other similar features or aspects in other embodiments.

What is claimed is:

1. A micro optical switch device comprising:
a substrate;
a first electrode directly contacting the substrate and having a plurality of openings;
a second electrode disposed above and spaced apart from the first electrode, and having a plurality of openings; and
support units disposed on the substrate and configured to support the second electrode,
wherein the support units comprise deformation preventing portions protruding beyond a top surface of the second electrode,
wherein the first electrode is located between the substrate and the second electrode, and
wherein the second electrode is movable in a first direction towards the first electrode or a second direction opposite to the first direction above the first electrode.

2. The micro optical switch device of claim 1, wherein the deformation preventing portions are provided at edge portions of the second electrode.

3. The micro optical switch device of claim 1, wherein the deformation preventing portions are formed of a material used to form the second electrode.

4. The micro optical switch device of claim 1, wherein the deformation preventing portions each have a concave-convex shape.

5. The micro optical switch device of claim 1, wherein the support units further comprise fixing portions disposed on the substrate.

6. The micro optical switch device of claim 5, wherein the fixing portions are spaced apart from the first electrode.

7. The micro optical switch device of claim 1, wherein the plurality of openings of the first electrode are offset from and do not overlap the plurality of openings of the second electrode.

8. The micro optical switch device of claim 1, further comprising an insulating layer interposed between the first electrode and the second electrode.

9. The micro optical switch device of claim 8, wherein the insulating layer is disposed on a region of the first electrode.

10. The micro optical switch device of claim 8, wherein the insulating layer is disposed on a bottom surface of the second electrode.

11. An image display apparatus comprising:
a backlight unit configured to output light;
the micro optical switch device of claim 1; and
a display panel configured to form an image by adjusting an amount of light which is emitted from the micro optical switch device.

12. A method of manufacturing a micro optical switch device, the method comprising:
forming a conductive material layer on a substrate and patterning the conductive material layer to form a first electrode including a first plurality of openings;
forming an insulating material layer on the substrate and the first electrode and patterning the insulating material layer to form an insulating layer;
forming a sacrificial layer on the substrate, the first electrode, and the insulating layer;
patterning a region of the sacrificial layer to form a hole exposing the substrate;
forming a pattern for forming deformation preventing portions on a region of the sacrificial layer adjacent to an inner side of the hole;
disposing a conductive material on the sacrificial layer, the pattern, and in the hole;
patterning the conductive material into a second electrode, the deformation preventing portions and fixing portions; and
removing the sacrificial layer and the pattern,
wherein the second electrode has a second plurality of openings,
wherein the first electrode is located between the substrate and the second electrode, and
wherein the second electrode is movable in a first direction towards the first electrode or a second direction opposite to the first direction above the first electrode.

13. The method of claim 12, wherein the insulating layer is formed between the first electrode and the second electrode where the first electrode and the second electrode overlap with each other.

14. The method of claim 12, wherein the hole is formed spaced apart from the first electrode.

15. A micro optical switch device comprising:
a substrate;
a first electrode that is directly contacting the substrate and has at least one opening;
a second electrode that has at least one opening that is offset from the at least one opening of the first electrode; and
a support structure that is disposed on an outer region of the substrate and supports the second electrode above and spaced apart from the first electrode, wherein the support structure is configured to prevent deformation of the second electrode, wherein the first electrode is located between the substrate and the second electrode, and wherein the second electrode is movable in a first direction towards the first electrode or a second direction opposite to the first direction above the first electrode.

16. The micro optical switch device of claim 15, wherein the support structure comprises:

fixing portions disposed on the outer region of the substrate and spaced apart from the first electrode; and deformation preventing portions extending from the fixing portions and having a shape configured to prevent deformation of the second electrode.

17. The micro optical switch device of claim 16, wherein the deformation preventing portions are formed of a material used to form the second electrode and have a concave-convex shape.

18. The micro optical switch device of claim 15, wherein the second electrode is disposed above the first electrode with partial overlap such that the at least one opening of the first electrode does not overlap with the at least one opening of the second electrode.

19. The micro optical switch device of claim 18, further comprising an insulating layer interposed between the first electrode and the second electrode at the partial overlap.

20. The micro optical switch device of claim 19, wherein the insulating layer is disposed on a top surface of the first electrode or a bottom surface of the second electrode.

* * * * *